US012633483B2

(12) United States Patent
Reinmuth et al.

(10) Patent No.: US 12,633,483 B2
(45) Date of Patent: May 19, 2026

(54) MEMS RELAY WITH SAFETY FUNCTION

(71) Applicant: Robert Bosch GmbH, Stuttgart (DE)

(72) Inventors: Jochen Reinmuth, Reutlingen (DE);
Johannes Holger Moeck,
Haigerloch-Hart (DE); Matthew Lewis,
Reutlingen (DE); Michael Krueger,
Reutlingen (DE)

(73) Assignee: ROBERT BOSCH GMBH, Stuttgart
(DE)

( * ) Notice: Subject to any disclaimer, the term of this
patent is extended or adjusted under 35
U.S.C. 154(b) by 370 days.

(21) Appl. No.: 18/355,340

(22) Filed: Jul. 19, 2023

(65) Prior Publication Data

US 2024/0038472 A1     Feb. 1, 2024

(30) Foreign Application Priority Data

Jul. 28, 2022     (DE) ..................... 10 2022 207 772.5

(51) Int. Cl.
H01H 59/00         (2006.01)
B81B 7/00          (2006.01)
(52) U.S. Cl.
CPC ....... H01H 59/0009 (2013.01); B81B 7/0032
(2013.01); B81B 2201/01 (2013.01)
(58) Field of Classification Search
CPC ... B81C 2203/00; B81C 2203/07; B81B 7/00;
B81B 7/0032; B81B 7/008; B81B 7/0087;
B81B 2201/01; B81B 2207/015; B81B
2207/03; H01H 1/0036; H01H 59/00;

H01H 59/0009; H01H 50/005; H01H
15/10; H01H 15/107; H01H 2001/0036;
H01H 47/002; G01R 31/50; G01R 35/005
USPC .......................................................... 200/181
See application file for complete search history.

(56) References Cited

U.S. PATENT DOCUMENTS

2011/0130721 A1*  6/2011  Foster ................... B81C 1/0023
                                                          607/9
2018/0006445 A1   1/2018  Weaver et al.

FOREIGN PATENT DOCUMENTS

DE        4022893 C1    8/1991
EP        2660663 A2    11/2013

* cited by examiner

*Primary Examiner* — Anthony R Jimenez
(74) *Attorney, Agent, or Firm* — NORTON ROSE
FULBRIGHT US LLP

(57) ABSTRACT

A micromechanical electrically actuable switch. The switch
has a first relay with a first operating contact, and a second
relay with a second operating contact. The first operating
contact and the second operating contact are arranged in
series in a common load path. The switch further includes a
detection device for detecting a switching state of the first
operating contact, and a control circuit for registering the
switching state of the first operating contact and for switch-
ing on the electrically actuable switch. The control circuit is
configured, upon a switch-on signal, to switch on the first
relay and the second relay in a first case, in which the
switching state of the first operating contact is "open", and
to not switch on at least the second relay in a second case,
in which the switching state of the first operating contact is
"closed".

10 Claims, 2 Drawing Sheets

MEMS RELAY WITH SAFETY FUNCTION

CROSS REFERENCE

The present application claims the benefit under 35 U.S.C. § 119 of German Patent Application No. DE 10 2022 207 772.5 filed on Jul. 28, 2022, which is expressly incorporated herein by reference in its entirety.

BACKGROUND INFORMATION

Classic relays are driven via a magnetic coil. They are relatively large and their power consumption in the connected state cannot be ignored. The switching forces are very high and, depending on the type, it is possible to switch high voltages and high currents. Depending on the design and operating conditions, such relays withstand up to several million switching cycles. If the relays fail, they almost always remain in the always-on state. This is disadvantageous in that, in the unintended always-on state, a voltage or current is also unintentionally supplied to further components and these components may thus be destroyed. Therefore, not only does the relay fail but, in addition, substantial secondary damage may also occur.

Capacitively driven MEMS relays have also been produced in recent years. These are significantly smaller. However, only low forces may be generated via the capacitive deflection. As a result of the defined MEMS production process, relays may be created which have a longer service life than comparable classic relays by two to three orders of magnitude. Owing to the relatively low reset forces, MEMS relays always fail in the unfavorable always-on state. There are two main causes for this. On the one hand, the contact surfaces degrade over time and this increases the adhesive force. On the other, the springs of the MEMS relay become fatigued, which reduces the reset forces.

SUMMARY

An object of the present invention is to provide a capacitively activated MEMS relay, which has a long service life and which reliably remains in an always-off state at the end of its service life.

The present invention relates to a micromechanical electrically actuable switch, having a first relay with a first operating contact, having a second relay with a second operating contact, the first operating contact and the second operating contact being arranged in series in a common load path.

According to an example embodiment of the present invention, it is provided to construct a two-stage, series-connected MEMS relay, in which at least the function of the first stage is monitored and, in the event of a failure of the first stage, the second stage is switched off and then remains switched off regardless of the control signal which is applied.

The simplest arrangement uses two MEMS relays with an evaluation and control circuit. The two relays are connected in series and at least a first of these relays has a detection device with which the switching state of the relay may be detected. If the ON signal is transmitted to the control circuit, the control circuit checks whether the first relay is in the switched-off state, i.e. has not yet reached the end of its service life. If this is the case, both relays are switched on by the control circuit. If the first relay is in the unintended switched-on state, the second relay, in particular, is not switched on.

Capacitively activated MEMS relays are particularly favorable in this arrangement since they may be switched particularly quickly.

According to an example embodiment of the present invention, in this arrangement, it is favorable to firstly switch on the second and then the first relay during the switch-on procedure and, conversely, the first relay should be switched off first during the switch-off procedure. Therefore, the electrical switching always takes place via the first relay, whereas the second relay is always switched passively, i.e. without a current flow. Switching, when energized may significantly reduce the service life. With this switching arrangement, it may be ensured that the first relay always fails first and the protective mechanism becomes active.

According to an example embodiment of the present invention, in this arrangement, it is further favorable to configure the second relay such that its reset force is somewhat higher. It may thus be achieved that the first relay always has a shorter service life than the second relay. With this arrangement, it may thus be ensured that the first relay always fails first and the protective mechanism becomes active.

According to an example embodiment of the present invention, in this arrangement, it is further favorable to configure the second relay such that its electrical conductivity in the ON state is somewhat higher. It may thus be achieved that, in the event of current or voltage peaks, the first relay always has a shorter service life than the second relay. With this arrangement, it may thus be ensured that the first relay always fails first and the protective mechanism becomes active.

According to an example embodiment of the present invention, it is particularly favorable if the two relays are realized within a MEMS chip. Due to the common production process and the local proximity on the wafer, both relays are mechanically very similar and typical scattering between different wafers or scattering of the parameters on the wafer are of no consequence. It is therefore particularly easy to produce the two last-mentioned favorable arrangements in a stable manner. Furthermore, two relays may be combined in a chip in a particularly simple and space-saving manner.

According to an example embodiment of the present invention, it is favorable for the user if the evaluation circuit is installed in a housing, together with the two relays. There is therefore no need for the user to wire the two relays and the control circuit.

In a technically more complex solution, according to an example embodiment of the present invention, the switching state may also be monitored at both series-connected relays. A particularly reliable relay can therefore be produced. Regardless of which of the two relays fails first, the failure may be detected and a safe OFF state may always be ensured.

According to an example embodiment of the present invention, in this arrangement, it is also favorable to switch the two relays in succession so that only one relay is affected in the case of voltage or current peaks and the further relay may serve as a safety relay.

According to an example embodiment of the present invention, in this arrangement of the switching sequence, it is particularly favorable to cyclically or randomly alternate between the two relays. It may thus be achieved that both relays are under similar load. The service life of the module may therefore be increased without adversely affecting the protective function.

According to an example embodiment of the present invention, the evaluation circuit may furthermore also send a feedback signal relating to the failure of the relay to the user, either via an interface such as SPI or via a control signal.

The novel arrangement may also be optionally used to send feedback regarding the failure of a relay to the user as a warning message whilst the arrangement remains in operation via the second relay. As a precautionary measure, the user may then change the relay module before the service life of the second relay is exceeded, with the system remaining fully functional in the meantime.

The arrangement is not restricted to two series-connected relays; it is also possible to use multiple series-connected relays whereof the switching state of at least one, or even more, is monitored and which are activated via a control circuit.

The arrangement is also not restricted to purely series-connected relays. By way of example, relay-matrix arrangements are also possible. In such arrangements, it is favorable to detect all switching states of the matrix arrangement and to place safety relays at the few inputs or outputs in each case in order to deactivate all of the switching matrices or some of the switching matrices in the event of a failure of a relay.

According to an example embodiment of the present invention, it is particularly favorable to use a first relay, which to detect the actual switching state of the first relay by measuring the capacitance of the movable structure with respect to a fixed counter electrode. Capacitive measurements are very quick and consume very little energy. A further counter electrode in a capacitive MEMS relay may furthermore be realized in a particularly simple manner.

The control of the two relays may take place via two separate lines of the control unit. In a particularly favorable variant of the present invention, however, both relays may also be controlled via the same capacitive signal. On the one hand, this can be easily realized in the control unit since it is not necessary to program in a time offset; on the other, quicker switching cycles may thus be achieved. To achieve this, it is advantageous to use a first relay which has a slower switch-on time and a shorter switch-off time than the second relay.

In a particularly favorable variant of the present invention, this may be achieved within a chip by using two relay structures, the first structure having a smaller drive electrode or a harder spring or both. The first relay therefore switches on later and disengages again sooner. As a result of the series connection of the two relays, it is thus guaranteed that the first relay is under higher load both during the switch-on procedure and during the switch-off procedure. This variant is favorable in that the remaining surface in the first relay may be used in a space-saving manner to form the detection electrode.

According to an example embodiment of the present invention, furthermore favorable is an operation of the control circuit which checks the state of the first relay when the relay is switched off in each case and, in the event of a malfunction, sets an internal flag so that a control signal is not sent to the relay if switching it back on when a flag is set. A particularly quick-acting relay may therefore be realized since the control circuit does not have to firstly evaluate the state of the first relay in terms of capacitance before it outputs a control signal. The flag may be a memory cell, but it may also be a physical part of the control circuit. If a malfunction of the first relay is observed, a thin trace may be burned out in the control circuit, for example, or a diode may be shot due to a voltage pulse. The thin trace or the diode are arranged in the control circuit such that, if this element is physically destroyed, a control signal may no longer be output to the relays and they are therefore deactivated.

DETAILED DESCRIPTION OF EXAMPLE EMBODIMENTS

Figure 1:
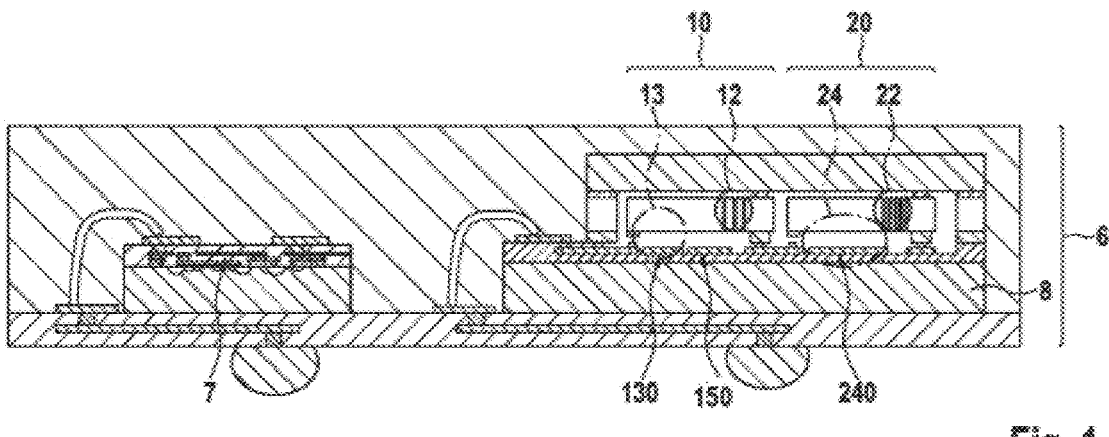
FIG. 1 shows a schematic representation of a MEMS relay according to an example embodiment of the present invention, with a safety function.

FIG. 1 shows an exemplary layout of the relay according to the present invention. A control circuit 7 and a MEMS relay module 8 with two relays are arranged in a housing 6. The two relays are connected in series. In a first relay 10, a smaller drive electrode 130 is provided for a first capacitively operating actuator 13. A first resetting spring 12 in the first relay is somewhat harder. The remaining surface near to the first drive electrode is used for a detection electrode 150. A position of the movable element of the first operating contact is detected capacitively by the detection electrode and the switching state is determined from this.

In a second relay 20, which serves as security in case the first relay fails, a second drive electrode 240, which is relatively large compared to the first drive electrode, is provided for a second actuator 24. If both drive electrodes are connected at the same time, the second relay closes first and is therefore not under load as a result of the connection procedure. In the second relay, a second resetting spring 22 is configured to be somewhat softer than the first resetting spring 12. If both drive electrodes are disconnected at the same time, the first relay opens first and is, in turn, under further load as a result of the disconnection procedure. If the first relay fails, i.e. the first operating contact remains in the switching state "closed" and therefore remains in the always-on state, this is identified by the control circuit through analysis of the signal of the detection electrode and the control circuit ensures that, from now on, the second relay always remains open. (Only a selection of individual electrical connections is shown in the figure).

Figure 2:
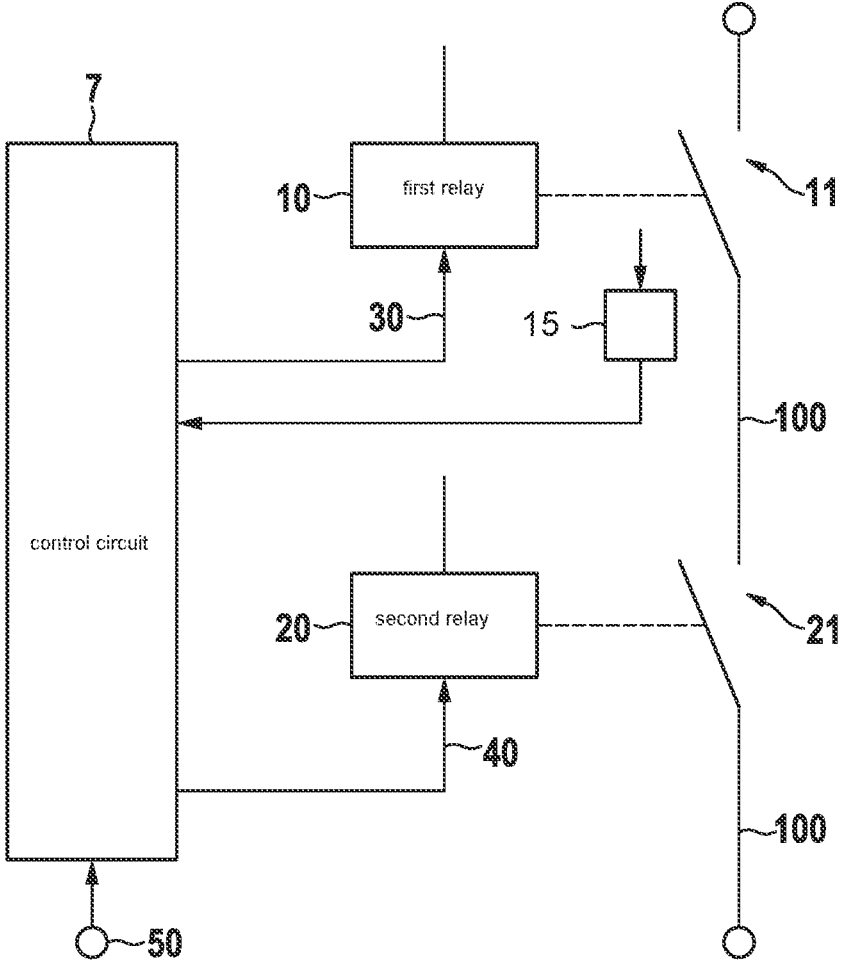
FIG. 2 shows a schematic circuit diagram of a MEMS relay according to an example embodiment of the present invention, with a safety function.

FIG. 2 shows a schematic circuit diagram of a MEMS relay according to the present invention, with a safety function. This shows an electrically actuable switch having a first relay 10 with a first operating contact 11, having a second relay 20 with a second operating contact 21, a detection device 15 for detecting a switching state of the first operating contact and a control circuit 7 for registering the switching state of the first operating contact and for switching on the electrically actuable switch. The first operating contact and the second operating contact are arranged in series in a common load path 100. The control circuit is designed, upon a switch-on signal 50, to switch on the first relay and the second relay in a first case, in which the switching state of the first operating contact is "open", and to not switch on at least the second relay in a second case, in which the switching state of the first operating contact is "closed". To this end, the control circuit outputs a first relay switching signal 30 and a second relay switching signal 40.

In an alternative exemplary embodiment (not depicted), a common relay switching signal is provided for both relays.

In an alternative exemplary embodiment (not depicted), a further detection device for also detecting a switching state of the second operating contact is further provided. In this example, the control circuit is also designed accordingly for registering the switching state of the second operating contact.

LIST OF REFERENCE SIGNS

10 First relay
11 First operating contact
12 First resetting spring
13 First actuator
15 Detection device
20 Second relay
21 Second operating contact
22 Second resetting spring
24 Second actuator
30 First relay switching signal
40 Second relay switching signal
50 Switch-on signal
6 Housing
7 Control circuit
8 MEMS relay module
100 Load path
130 First drive electrode
150 Detection electrode
240 Second drive electrode

What is claimed is:

1. A micromechanical electrically actuable switch, comprising:
   a first relay having a first operating contact;
   a second relay having a second operating contact, the first operating contact and the second operating contact being arranged in series in a common load path;
   a detection electrode configured to detect a position of the first operating contact;
   a control circuit configured to receive a signal from the detection electrode indicating a switching state of the first operating contact, and to output control signals to the first relay and the second relay to switch on the electrically actuable switch, and the control circuit being configured such that, upon receiving a switch-on signal:
      the control circuit switches on the first relay and the second relay when the first operating contact is in an open position, and the control circuit does not switch on at least the second relay when the first operating contact is in a closed position.

2. The micromechanical electrically actuable switch as recited in claim 1, wherein the second operating contact has a shorter operate time than the first operating contact, and the first operating contact has a shorter release time than the second operating contact.

3. The micromechanical electrically actuable switch as recited in claim 1, wherein, when the first and second operating contacts are closed, the second operating contact has a higher electrical conductivity than the first operating contact.

4. The micromechanical electrically actuable switch as recited in claim 1, wherein the detection electrode is configured for capacitive detection of the first operating contact.

5. The micromechanical electrically actuable switch as recited in claim 1, wherein the control circuit is configured to output an error signal relating to an error of the first relay in the second case.

6. The micromechanical electrically actuable switch as recited in claim 1, wherein the first relay is integrated with the second relay in a common MEMS (micro-electro-mechanical system) relay module on a common micromechanical substrate.

7. The micromechanical electrically actuable switch as recited in claim 1, wherein the first operating contact can be actuated by a first actuator and a first resetting spring and the second operating contact can be actuated by a second actuator and a second resetting spring.

8. The micromechanical electrically actuable switch as recited in claim 7, wherein the first actuator and the second actuator are each a capacitive actuator configured to move a respective operating contact by applying a voltage to a respective drive electrode.

9. The micromechanical electrically actuable switch as recited in claim 7, wherein the second resetting spring has a higher spring constant than the first resetting spring.

10. The micromechanical electrically actuable switch as recited in claim 7, wherein the first actuator has a first drive electrode, the second actuator has a second drive electrode, and the second drive electrode is larger than the first drive electrode.

* * * * *